(12) United States Patent
Kee

(10) Patent No.: US 7,309,923 B2
(45) Date of Patent: Dec. 18, 2007

(54) INTEGRATED CIRCUIT PACKAGE HAVING STACKED INTEGRATED CIRCUITS AND METHOD THEREFOR

(75) Inventor: Soochok Kee, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 10/463,742

(22) Filed: Jun. 16, 2003

(65) Prior Publication Data

US 2004/0251557 A1   Dec. 16, 2004

(51) Int. Cl.
*H01L 23/48*   (2006.01)
*H01L 23/02*   (2006.01)

(52) U.S. Cl. ................ 257/777; 257/666; 257/686

(58) Field of Classification Search ............ 257/685, 257/686, 777, 776, 666, 778; 438/107–110, 438/123
See application file for complete search history.

(56) References Cited

U.S. PATENT DOCUMENTS

| | | | |
|---|---|---|---|
| 4,920,074 A | | 4/1990 | Shimizue et al. |
| 5,041,901 A | | 8/1991 | Kitano et al. |
| 5,221,858 A | | 6/1993 | Higgins, III |
| 5,291,061 A | * | 3/1994 | Ball ........................ 257/686 |
| 5,331,235 A | * | 7/1994 | Chun ........................ 257/777 |
| 5,422,435 A | | 6/1995 | Takiar et al. |
| 5,495,398 A | | 2/1996 | Takiar et al. |
| 5,502,289 A | | 3/1996 | Takiar et al. |
| 5,596,225 A | | 1/1997 | Mathew et al. |
| 5,617,297 A | | 4/1997 | Lo et al. |
| 5,625,221 A | * | 4/1997 | Kim et al. ............... 257/686 |
| 5,629,563 A | | 5/1997 | Takiar et al. |
| 5,677,567 A | * | 10/1997 | Ma et al. ................. 257/666 |
| 5,776,797 A | | 7/1998 | Nicewarner, Jr. et al. |
| 5,804,880 A | | 9/1998 | Mathew |
| 5,917,242 A | * | 6/1999 | Ball ........................ 257/737 |
| 5,986,209 A | | 11/1999 | Tandy |
| 6,072,233 A | | 6/2000 | Corisis et al. |
| 6,080,264 A | | 6/2000 | Ball |
| 6,137,163 A | | 10/2000 | Kim et al. |
| 6,301,121 B1 | * | 10/2001 | Lin ........................ 361/783 |
| 6,303,997 B1 | | 10/2001 | Lee |
| 6,323,060 B1 | | 11/2001 | Isaak |

(Continued)

FOREIGN PATENT DOCUMENTS

JP   4-321261   11/1992

OTHER PUBLICATIONS

International Search Report dated May 25, 2005 from corresponding International Application No. PCT/US2004/018020.

(Continued)

*Primary Examiner*—Hung Vu
(74) *Attorney, Agent, or Firm*—Beyer Weaver LLP

(57) ABSTRACT

Improved approaches to stacking integrated circuit chips within an integrated circuit package are disclosed. The improved approaches enable increased integrated circuit density within integrated circuit packages, yet the resulting integrated circuit packages are thin or low profile. These improved approaches are particularly useful for stacking same size (and often same function) integrated circuit chips with integrated circuit packages. One example of such an integrated circuit package is a non-volatile memory integrated circuit package that contains multiple, like-sized memory storage integrated circuit chips stacked on one or both sides of a leadframe.

21 Claims, 8 Drawing Sheets

U.S. PATENT DOCUMENTS

| | | | |
|---|---|---|---|
| 6,378,758 | B1 | 4/2002 | Haba |
| 6,437,433 | B1 | 8/2002 | Ross |
| 6,455,928 | B2 | 9/2002 | Corisis et al. |
| 6,458,617 | B1* | 10/2002 | Liao et al. .................... 438/51 |
| 6,476,475 | B1 | 11/2002 | Lee |
| 6,482,677 | B2 | 11/2002 | Sato et al. |
| 6,577,012 | B1 | 6/2003 | Greenwood et al. |
| 6,674,173 | B1* | 1/2004 | Wang ......................... 257/777 |
| 6,677,181 | B2* | 1/2004 | Park et al. ................... 438/112 |
| 6,984,881 | B2* | 1/2006 | Takiar ........................ 257/685 |
| 7,012,325 | B2* | 3/2006 | Ahn et al. ................... 257/678 |
| 2001/0013645 | A1 | 8/2001 | King et al. |
| 2002/0149091 | A1 | 10/2002 | Palmteer et al. |
| 2002/0158325 | A1 | 10/2002 | Yano et al. |
| 2003/0011068 | A1 | 1/2003 | Song et al. |
| 2003/0197260 | A1* | 10/2003 | Nishimura et al. ......... 257/686 |
| 2004/0229401 | A1 | 11/2004 | Bolken et al. |

OTHER PUBLICATIONS

Written Opinion of the International Searching Authority dated May 25, 2005 from corresponding International Application No. PCT/US2004/018020.

European Office Action dated Jun. 8, 2006 from corresponding European Application No. 04754588.4.

Summons to attend oral proceedings dated Feb. 22, 2007 from corresponding European Patent Application No. 04754588.4.

Eric Bogatin, *Roadmaps of Packaging Technology*, published by Integrated Circuit Engineering Corporation, 1997, Chapter 13, "Next Generation Technologies," pp. 13-1 thru 13-34.

Al-sarawi et al., "A Review of 3-D Packaging Technology," IEEE Transactions on Components, Packaging, and Manufacturing Technology, Part B, vol. 21, No. 1, Feb. 1998, pp. 2-14.

"MicroLeadFrame Package," data sheet, Amkor Technology, Inc., 2 pages, Aug. 2002.

*Application Notes for Surface Mount Assembly of Amkor's MicroLeadFrame (MLF) Packages*, Amkor Technology, Inc., Rev. C, Sep. 2002, pp. 1-18.

"Flip Chip MicroLeadFrame (fcMLF) Package," data sheet, Amkor Technology, Inc., 2 pages, Oct. 2002.

"RF Wireless," fact sheet, Amkor Technology, Inc., 1 page, Feb. 2, 2004.

"Amkor Expanding MicroLeadFrame Capacity to Meet Market Demand," press release, Amkor Technology, Inc., Sep. 23, 2002, 2 pages.

"Amkor Starts Producing Saw-Singulated QFN Packages," press release, Amkor Technology, Inc., Nov. 12, 2001, 2 pages.

"MicroLeadFrame (MLF)," product data sheet, Amkor Technology, Inc., 3 pages, downloaded from http://www.amkor.com/products/All_Products.MLF.cfm on Dec. 3, 2002.

"MLF Packaging Process," informational slides, Amkor Technology, Inc., 4 sheets, Feb. 2, 2004.

"Automotive/Thermal Enhanced Power Products," informational slides, Amkor Technology, Inc., 2000, 16 sheets.

Hara, "Sharp package stacks chips in system integration play," EE Times, Jul. 30, 1999, 4 pages.

Sharp IC Packaging Services by Sharp Foundry, product information data sheet, Sharp Microelectronics of the Americas, downloaded from http://www.sharpsma.com/foundry/ic-packaging.htm on Feb. 5, 2003.

Sharp SMA Stacked CSP, website product information sheet (downloaded Dec. 6, 2002 from http://www.sharpsma.com/sma/products/memory/Packages/Stacked_CSP.htm) pp. 1-2.

Sharp Combination Memories (Stacked CSP), website product datasheet (downloaded Dec. 17, 2002 from http://sharp-world.com/products/device/flash/cmlist.html), pp. 1-3.

Kada et al., "Advancements in Stacked Chip Scale Packaging (S-CSP), Provides System-in-a-Package Functionality for Wireless and Handheld Applications," Proceedings of Pan Pacific Microelectronics Symposium Conference, Jan. 2000, pp. 1-7.

Sharp SMA Flash Memories CSP, website product information sheet (downloaded Dec. 6, 2002 from http://www.sharpsma.com/sma/products/memory/Packages/CSP.htm), pp. 1-2.

John H. Day, "Packaging Options Stack Up for Stacking Active Devices," EE Times, Oct. 4, 2001, pp. 1-4.

LRS13023: Stacked Chip 8M Flash and 1M SRAM, Sharp Integrated Circuits Group, product specification, Spec. No. EL116039, Jun. 11, 1999, pp. 1-60.

* cited by examiner

INTEGRATED CIRCUIT PACKAGE HAVING STACKED INTEGRATED CIRCUITS AND METHOD THEREFOR

CROSS-REFERENCE TO RELATED APPLICATION

This application is related to U.S. patent application Ser. No.10/463051, filed concurrently herewith, and entitled "STACKABLE INTEGRATED CIRCUIT PACKAGE AND METHOD THEREFOR", and which is hereby incorporated by reference herein.

BACKGROUND OF THE INVENTION

1. Field of the Invention

The present invention relates to integrated circuit packages and, more particularly, to integrated circuit packages that include stacked integrated circuits.

2. Description of the Related Art

As the trend for memory integrated circuit (IC) packages to be smaller and their memory density to be larger continues, advancements in packaging integrated circuits are needed. One recent advancement involves stacking multiple integrated circuit dies within a single IC package. In one approach, such stacking involves stacking a smaller die on a larger die. Each of the dies is wire bonded to a substrate. The use of wire bonding necessarily requires that access to bonding pads of each of the dies be available; consequently, the upper die, when stacked on the lower die, must be small so as to not inhibit access to the bonding pads of the lower die. This type of stacking has, for example, been used with same function dies (e.g., two Flash memory dies) or different function dies (e.g., one Flash memory die and one SRAM die). Stacking of two or three dies has been done for stacked Chip Scale Packages (stacked CSP) and stacked Thin Small Outline Packages (TSOP). In another approach, like-sized dies can be stacked by placing a spacer, namely a relatively thick insulator, between the dies. Although the spacer provides the lower die with sufficient space so that it can be wire bonded, the spacer disadvantageously makes the integrated circuit package thicker.

Unfortunately, conventional approaches to stacking multiple dies within an integrated circuit package either require that the upper die be substantially smaller than the lower die on which the upper die is stacked or inefficiently consume package thickness. As a result, the conventional approaches are not suitable for use when the multiple dies are the same size and resulting package thickness is important. Accordingly, there is a need for improved approaches to stacking multiple dies within an integrated circuit package.

SUMMARY OF THE INVENTION

Broadly speaking, the invention relates to improved approaches to stacking integrated circuit chips within an integrated circuit package. The improved approaches enable increased integrated circuit density within integrated circuit packages, yet the resulting integrated circuit packages are thin or low profile. These improved approaches are particularly useful for stacking same size (and often same function) integrated circuit chips with integrated circuit packages. One example of such an integrated circuit package is a non-volatile memory integrated circuit package that contains multiple, like-sized memory storage integrated circuit chips stacked on one or both sides of a leadframe.

The invention can be implemented in numerous ways, including as a system, apparatus, device or method. Several embodiments of the invention are discussed below.

As an integrated circuit package, one embodiment of the invention includes at least: a leadframe having a plurality of electrically conductive leads; a first integrated circuit die having a active side and a non-active side, the active side of the first integrated circuit die having bonding pads that are electrically connected to the electrically conductive leads of the leadframe; an adhesive provided on the non-active side of the first integrated circuit die; and a second integrated circuit die having a active side and a non-active side, the non-active side of the second integrated circuit die being affixed to the non-active side of the first integrated circuit die by the adhesive, and the active side of the second integrated circuit die having bonding pads that are electrically connected to the electrically conductive leads of the leadframe. Each of the first and second integrated circuit dies is about the same size.

As a integrated circuit package, another embodiment of the invention includes at least: a leadframe having a plurality of electrically conductive leads; a first integrated circuit die having a active side and a non-active side, the active side of said first integrated circuit die having bonding pads that are electrically connected to the electrically conductive leads of the leadframe; and a second integrated circuit die having a active side and a non-active side, the active side of said second integrated circuit die having bonding pads that are electrically connected to the electrically conductive leads of the leadframe.

As an integrated circuit package, still another embodiment of the invention includes at least: a leadframe having a plurality of electrically conductive leads; a first integrated circuit die having a active side and a non-active side, the active side of the first integrated circuit die having bonding pads that are electrically connected to the electrically conductive leads of the leadframe; a second integrated circuit die having a active side and a non-active side, the active side of the second integrated circuit die having bonding pads that are electrically connected to the electrically conductive leads of the leadframe; a lower adhesive provided on the non-active side of the first integrated circuit die; a third integrated circuit die having a active side and a non-active side, the non-active side of the third integrated circuit die being affixed to the non-active side of the first integrated circuit die by the lower adhesive, and the active side of the third integrated circuit die having bonding pads that are electrically connected to the electrically conductive leads of the leadframe; an upper adhesive provided on the non-active side of the second integrated circuit die; and a fourth integrated circuit die having a active side and a non-active side, the non-active side of the fourth integrated circuit die being affixed to the non-active side of the second integrated circuit die by the upper adhesive, and the active side of the fourth integrated circuit die having bonding pads that are electrically connected to the electrically conductive leads of the leadframe. Each of the first, second, third and fourth integrated circuit dies is about the same size.

As a method for forming an integrated circuit package having a leadframe and four or more integrated circuit dies stacked therein, one embodiment of the invention includes at least the acts of: obtaining a leadframe having a plurality of leads, at least a plurality of the leads having lead fingers; obtaining first and second integrated circuit dies having solder balls on respective sets of bonding pads, the bonding pads of the first and second integrated circuit dies are mirrored arrangements of one another; obtaining third and fourth integrated circuit dies having respective sets of bonding pads; arranging the first integrated circuit die with respect to a first side of the leadframe; bonding at least a plurality of the lead fingers of the leadframe to the bonding pads of the first integrated circuit die using solder balls provided on the bonding pads; arranging the second integrated circuit die with respect to a second side of the leadframe; reflowing the solder balls on the bonding pads of the first and second integrated circuit dies, thereby electrically connecting each of the plurality of the lead fingers of the leadframe to a corresponding pair of the bond pads; adhering the third integrated circuit die to the first integrated circuit die; adhering the fourth integrated circuit die to the second integrated circuit die; wire bonding the bond pads of the third integrated circuit die to the leads of the leadframe; wire bonding the bond pads of the fourth integrated circuit die to the leads of the leadframe; and encapsulating the first, second, third and fourth integrated circuit dies, the solder balls and wire bonds, and at least a substantial portion of the leadframe.

As a method for stacking integrated circuit dies in an integrated circuit package, one embodiment of the invention includes at least the acts of: providing a leadframe having a plurality of leads, the leadframe having a top side and a bottom side; electrically connecting bonding pads on a front side (active side) of a first integrated circuit die to the leads on the bottom side of the leadframe by way of solder balls; electrically connecting bonding pads on a front side (active side) of a second integrated circuit die to the leads on the top side of the leadframe by way of solder balls; attaching a back side (non-active side) of a third integrated circuit die to the back side (non-active side) of the first integrated circuit die; attaching a back side (non-active side) of a fourth integrated circuit die to the back side (non-active side) of the second integrated circuit die; electrically connecting bonding pads of the front side (active side) of the third integrated circuit die to the leads on the bottom side of the leadframe by way of wire bonds; and electrically connecting bonding pads of the front side (active side) of the fourth integrated circuit die to the leads on the top side of the leadframe by way of wire bonds.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to improved approaches to stacking integrated circuit chips within an integrated circuit package. The improved approaches enable increased integrated circuit density within integrated circuit packages, yet the resulting integrated circuit packages are thin or low profile. These improved approaches are particularly useful for stacking same size (and often same function) integrated circuit chips with integrated circuit packages. One example of such an integrated circuit package is a non-volatile memory integrated circuit package that contains multiple, like-sized memory storage integrated circuit chips stacked on one or both sides of a leadframe.

Embodiments of this aspect of the invention are discussed below with reference to FIGS. 1-7. However, those skilled in the art will readily appreciate that the detailed description given herein with respect to these figures is for explanatory purposes as the invention extends beyond these limited embodiments.

Figure 1:
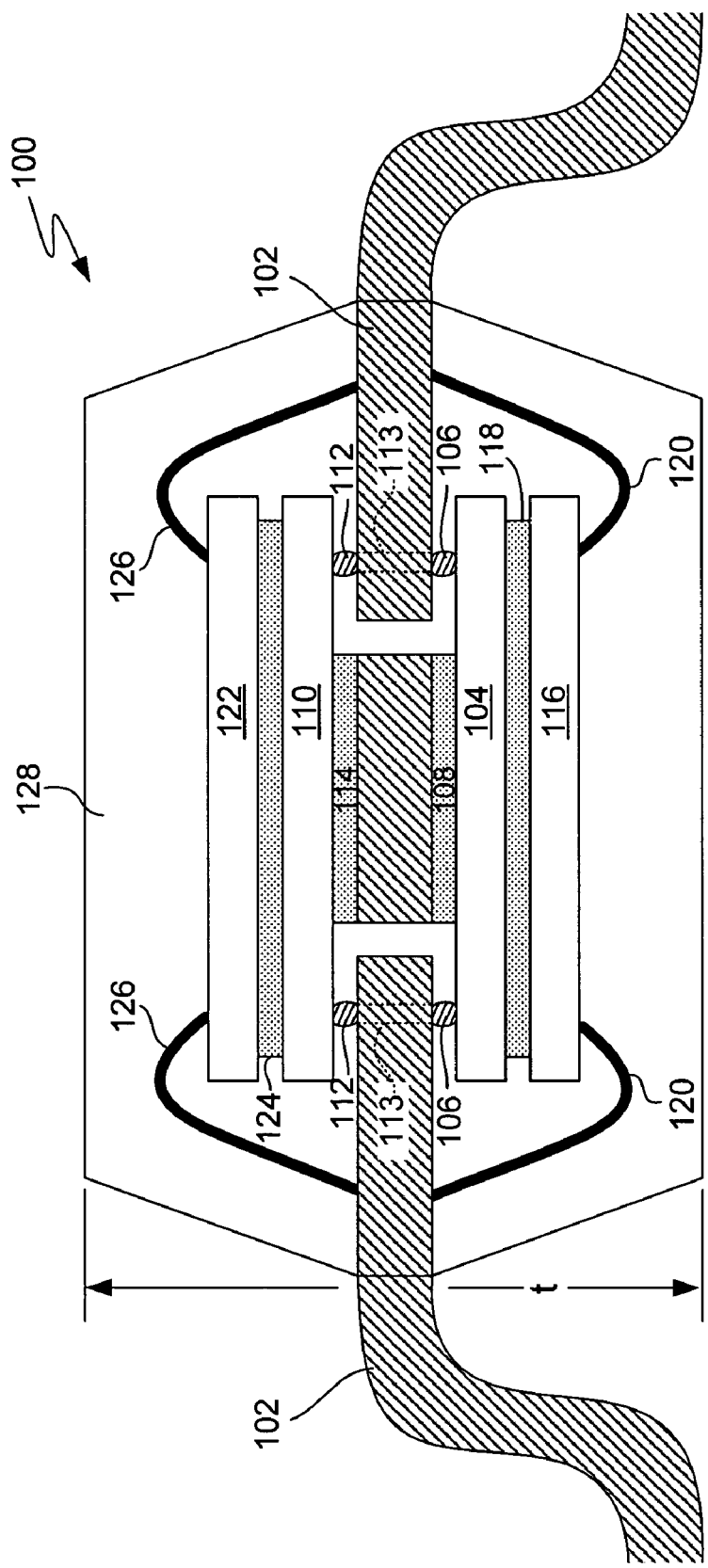
FIG. 1 is a cross-sectional view of an integrated circuit package according to one embodiment of the invention.

FIG. 1 is a cross-sectional view of an integrated circuit package 100 according to one embodiment of the invention. The integrated circuit package 100 is a low profile or thin integrated circuit package that houses multiple integrated circuit chips (dies) in a stacked manner.

The integrated circuit package 100 has a leadframe 102 that extends through the integrated circuit package 100. The leadframe 102 provides a plurality of leads for different electrical connections internal to the integrated circuit package 100. The leads of the leadframe 102 extend outward from the integrated circuit package 100 to facilitate coupling to an electrical product. One example of an electrical product is a printed circuit board. The configuration of the leads of the leadframe 102 are suitable for surface mounting of the packages. However, it should be recognized that other configurations or types of leads can be used.

The leadframe 102 has a top surface and a bottom surface. A first integrated circuit die 104 is electrically connected to a bottom surface of the leadframe 102 by way of solder balls 106. Optionally, an adhesive layer 108 can be provided between a least a portion of the front surface of the first integrated circuit die 104 and the bottom surface of the leadframe 102 so as to assist in attachment or adhering the first integrated circuit die 104 to the bottom surface of the leadframe 102. A second integrated circuit die 110 couples to a top surface of the lead frame 102 by way of solder balls 112. The solder balls 106 couple different bond pads of the first integrated circuit die 104 to different leads of the leadframe 102. Likewise, the solder balls 112 couple bond pads of the second integrated circuit die 110 to leads of leadframe 102. Optionally, an adhesive layer 114 can be provided between at least a portion of the front side of the second integrated circuit die 110 and the top surface of the leadframe 102 so as to assist in attachment or adhering the second integrated circuit die 110 to the top surface of the leadframe 102. In one embodiment, the leadframe 102 includes a die attach pad in the central region of the leadframe 102 and, in such an embodiment, the optional adhesive layers 108 and 114 can adhere to the die attach pad (bottom and top surfaces, respectively) to thereby adhere or affix the first and second integrated circuit dies 104, 110 to the leadframe 102.

Additionally, a third integrated circuit die 116 is stacked on the first integrated circuit die 104. More particularly, the back side (non-active side) of the third integrated circuit die 116 is adhered or affixed to the back side of the first integrated circuit die 104. An adhesive layer 118 can be provided between the back side of the third integrated circuit die 116 and the back side of the first integrated circuit die 104 to adhere or affix these dies together. The front side (active side) of the third integrated circuit die 116 includes bonding pads that are coupled to the bottom side of leads of the leadframe 102 by wire bonds 120.

A fourth integrated circuit die 122 is stacked on the second integrated circuit die 110. More particularly, the back side of the fourth integrated circuit die 122 is adhered or affixed to the back side of the second integrated circuit die 110. An adhesive layer 124 can be provided between the back side of the fourth integrated circuit die 122 and the back side of the second integrated circuit die 110 to adhere or affix these dies together. The front side of the fourth integrated circuit die 122 includes bonding pads that are coupled to the top side of leads of the lead frame 102 via wire bonds 126.

An encapsulant 128 is molded to form a body for the integrated circuit package 100. The thickness (t) of the body 128 can be not more than 1 millimeter (mm). Hence, the integrated circuit package 100 is a thin or low profile package. For example, the integrated circuit package 100 can be referred to, in one embodiment, as a Thin Small Outline Package (TSOP). In one embodiment, the integrated circuit package 100 can be a forty-eight (48) pin TSOP which is common for certain memory chip packages. Although not all forty-eight (48) pins are usually utilized, the configuration (i.e., footprint) would be standard. Nevertheless, the invention allows a plurality of integrated circuit dies to be stacked within the integrated circuit package 100, yet enables the integrated circuit package 100 to have a low, thin profile. For example, when the plurality of integrated circuit dies stacked in the integrated circuit package 100 are memory storage chips, then the resulting integrated circuit package 100 yields a high density memory chip package in a small, thin space. For example, in one embodiment, the invention can be used to at least double the number of integrated circuit dies within a memory chip package without increasing the thickness or area of the package.

In one embodiment, each of the first, second, third and fourth integrated circuit dies 104, 110, 116 and 122 are integrated circuit dies that have the same size and same functionality. For example, if the integrated circuit package 100 pertains to a memory integrated circuit package, then the integrated circuit dies are each memory dies of the same size. Each of the integrated circuit dies 104, 110, 116 and 122 are, however, slightly different. A first difference is that the bonding pads on the front side of the first integrated circuit die 104 are arranged in a mirror fashion with respect to the bonding pads of the front side of the second integrated circuit die 110. A second difference is that the bonding pads on the front side of the third integrated circuit die 116 are arranged in a mirror fashion with respect to the bonding pads of the front side of the fourth integrated circuit die 122. The second difference is not necessary but provides a practical approach for consistent, non-complex wire bonding. A third difference is that the pitch (or separation) between bonding pads can be different. Namely, the pitch of the bonding pads for the first and second integrated circuit dies 104, 110 is sufficiently wide enough to permit reliable solder ball bonding with the leadframe 102. As previously noted, the first integrated circuit die 104 and the second integrated circuit die 110 are bonded to the leads of the lead frame 102 through solder balls 106 and 112, respectively. For example, the pitch of the bonding pads of these integrated circuit dies 104, 110 for reliable fabrication should be on the order of about 0.5 mm (~20 mils) or more, more generally, at least about 0.25 mm (~10 mils) or more. On the other hand, the pitch of the bonding pads for the third and fourth integrated circuit dies 116, 122 can be more narrow because wire bonding is used. The third difference is not necessary, that is, the pitch of the bonding pads of the third and fourth integrated circuit dies 116, 122 could be same or different from that of the bonding pads of the first and second integrated circuit dies 104, 110.

Figure 2A:
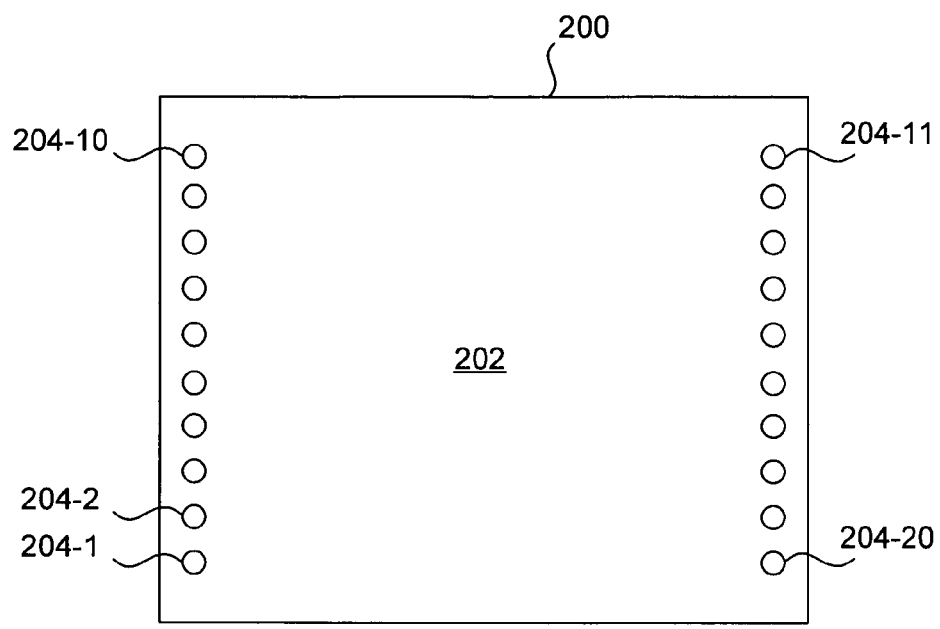
FIG. 2A is a top view of a representative integrated circuit die according to one embodiment of the invention.

FIG. 2A is a top view of a representative integrated circuit die 200 according to one embodiment of the invention. The integrated circuit die 200 is, for example, suitable for use as the first integrated circuit die 104 illustrated in FIG. 1. The integrated circuit die 200 has a top surface 202 that includes an arrangement of twenty (20) bonding pads 204. The bonding pads 204 are numbered from one to twenty, such that the first bonding pad is denoted 204-1 and the last bonding pad is denoted 204-20.

Figure 2B:
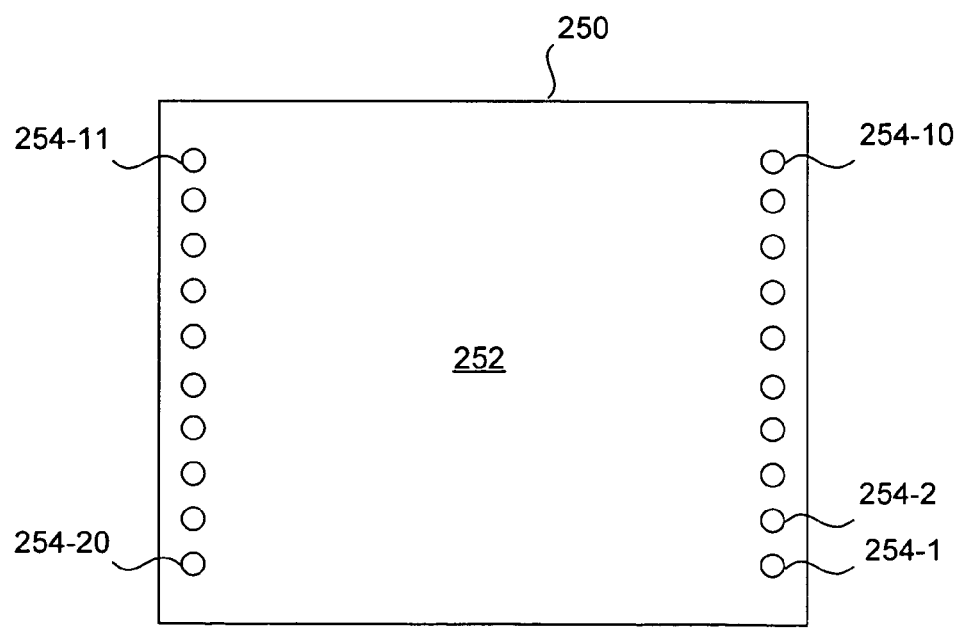
FIG. 2B is a top view of a representative integrated circuit die according to one embodiment of the invention.

As previously noted, the second integrated circuit die 110 has its bonding pads arranged in a mirror fashion as compared to the arrangement of the bonding pads for the first integrated circuit die 104. FIG. 2B is a top view of a representative integrated circuit die 250 according to one embodiment of the invention. The integrated circuit die 250 has a top surface 252 that includes twenty (20) bonding pads 254. The bonding pads 254 are numbered from one to twenty, such that the first bonding pad is denoted 254-1 and the last bonding pad is denoted 254-20.

It should be noted that the arrangement of the bonding pads on the top surface 252 of the integrated circuit die 250 shown in FIG. 2A are arranged in a mirror fashion with respect to the bonding pads of the top surface 202 of the integrated circuit die 200 shown in FIG. 2B. The mirror arrangement operates to facilitate the electrical connection of the first and second integrated circuit dies 104, 200 and 110, 250 to common leads of the lead frame 102. For example, functionally identical bonding pads on the first integrated circuit die 104, 200 and the second integrated circuit die 110, 250 are, when assembled, vertically aligned from one another and thus couple to the same lead of the lead frame 102.

Figure 3A:
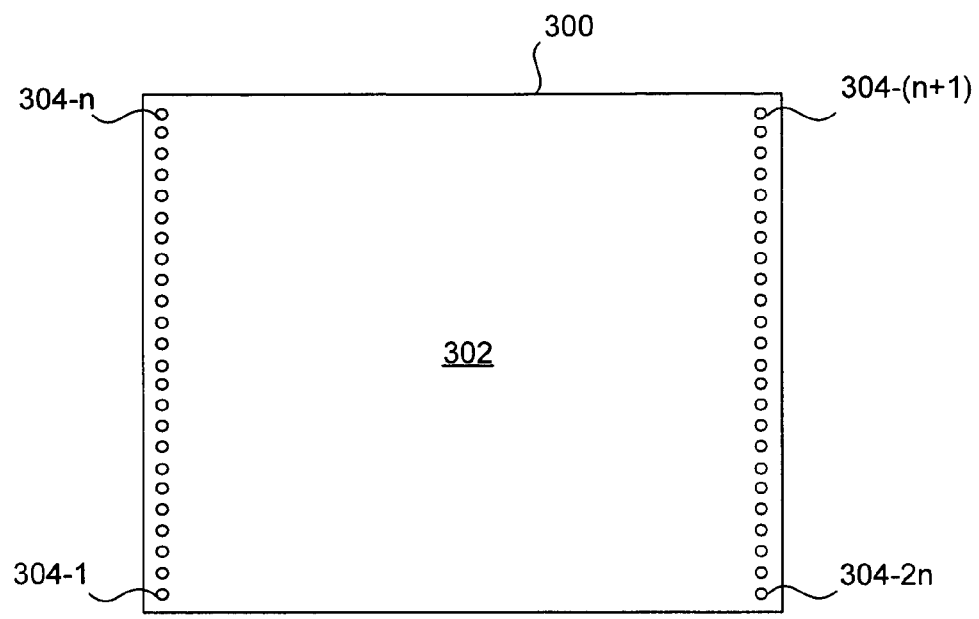
FIG. 3A is a top view of a representative integrated circuit die according to one embodiment of the invention.

Also, as previously noted, the fourth integrated circuit die 122 may have its bonding pads arranged in a mirror fashion as compared to the arrangement of the bonding pads for the third integrated circuit die 116. FIG. 3A is a top view of a representative integrated circuit die 300 according to one embodiment of the invention. The integrated circuit die 300 includes a top surface 302 that includes $2n$ bonding pads 304. The bonding pads are arranged from a first bonding pad 304-1 to a last bonding pad 304-2n. The integrated circuit die 300 can, for example, pertain to the arrangement of bonding pads utilized by the third integrated circuit die 116 illustrated in FIG. 1.

Figure 3B:
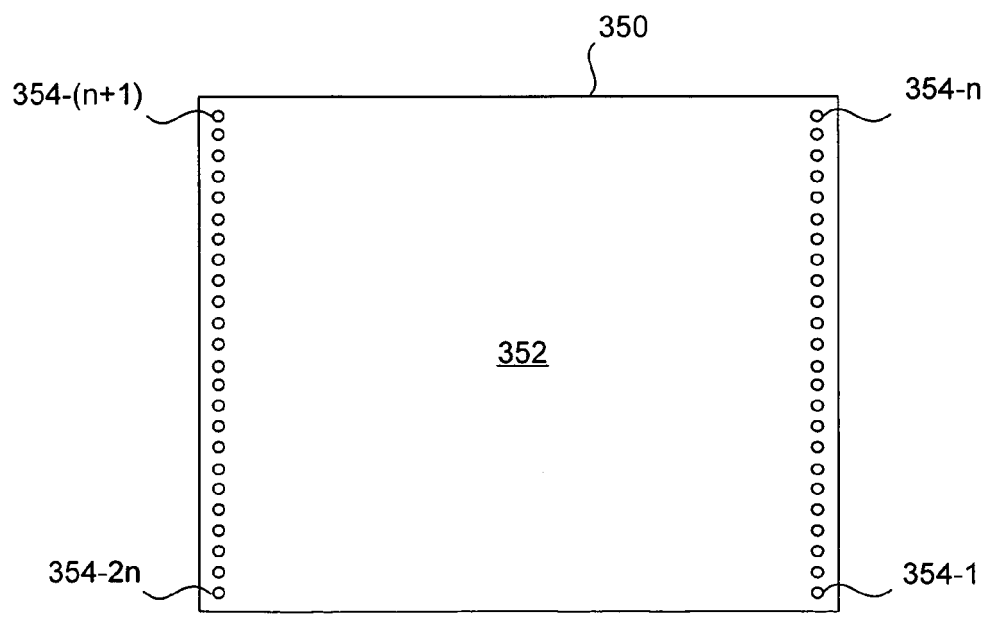
FIG. 3B is a top view of a representative integrated circuit die according to one embodiment of the invention.

FIG. 3B is a top view of a representative integrated circuit die 350 according to one embodiment of the invention. The integrated circuit die 350 includes a top surface 352 that includes $2n$ bonding pads 354. The bonding pads are arranged from a first bonding pad 354-1 to a last bonding pad 354-2n. The integrated circuit die 350 can, for example, pertain to the arrangement of bonding pads utilized by the fourth integrated circuit die 122 illustrated in FIG. 1.

It should be noted that the bonding pads 354 of the integrated circuit die 350 are identically positioned on the top surface 352 as are the bonding pads 304 on the top surface 302 of the integrated circuit die 300. However, it should also be noted that the bonding pads 354 are arranged on the top surface 352 of the integrated circuit die 350 in a mirror manner as compared to the arrangement of the bonding pads 304 on the top surface 302 of the integrated circuit die 300. The mirror arrangement facilitates the wire bonding of the bonding pads 304, 354 to leads of the leadframe 102. However, in other embodiments, it is not necessary for precise mirror arrangements of the bonding pads 304, 354 to be utilized given the flexibility provided through use of wire bonding.

Additionally, it should be noted that the area of the bonding pads 304, 354 and their pitch shown in FIGS. 3A and 3B are both smaller as compared to the area of the bonding pads 204, 254 and the pitch thereof shown in FIGS. 2A and 2B. In other words, the bonding pads 304, 354 do not have to meet special requirements and can use typical bonding pad size and pitch, which can reduce costs. Hence, since the bonding pads utilized by the third and fourth integrated circuit dies 116 and 122 illustrated in FIG. 1 utilized wire bonds 120, 126, the bonding pads can remain relatively small with high pitches. As such, the size and pitch of the bonding pads utilized by the third and fourth integrated circuit dies 116, 300 and 122, 350 do not have to meet special requirements and can use typical bonding pad size and pitch. For example, typical pitch for bonding pads in today's integrated circuit dies is on the order of about 0.1-0.15 mm (~4-6 mils).

Figure 4:
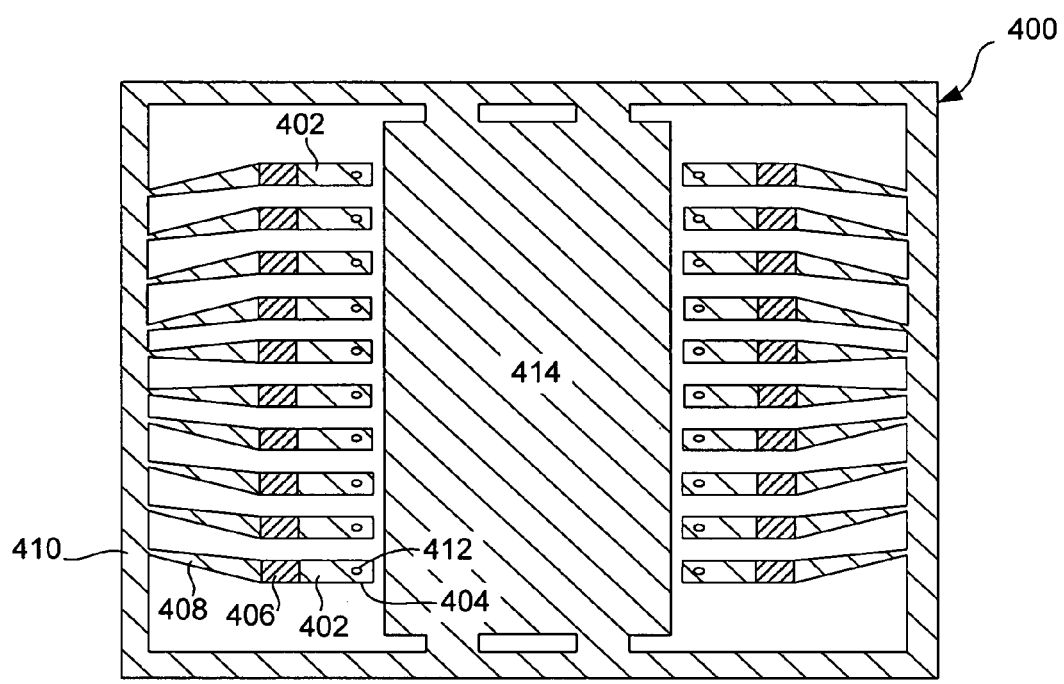
FIG. 4 is a top view of a leadframe according to one embodiment of the invention.

FIG. 4 is a top view of a leadframe 400 according to one embodiment of the invention. The leadframe 400 includes a plurality of leads 402. Each of the leads 402 has a lead finger 404, a flattened area 406 and a peripheral lead portion 408.

At the periphery of the lead frame 400 is a dambar 410 that secures and/or supports the ends of the peripheral lead portions 408 during manufacture of the integrated circuit package. The dambar 410 is removed at the later stages of package manufacturing. The lead fingers 404 include openings, or small holes, at the location along the leads where the solder balls (e.g., solder balls 106, 112) couple to the leads.

As a result, corresponding solder balls on both sides of a lead of the leadframe 102, 400 have a vertical alignment with one another, and when the solder is reflowed to form an electrical connection, a single solder connection results between the associated lead of the leadframe, the associated bond pad of an upper integrated circuit die, and the associated bond pad of a lower integrated circuit die. In other words, given the mirror arrangement, like bonding pads of upper and lower integrated circuit dies (e.g., first and second integrated circuit dies 104, 110) are soldered to appropriate leads of a leadframe. The leadframe 400 may also includes a die attach area 414 at the center region of the leadframe 400. The die attach area 414 can provide a structure for the upper and lower integrated circuit dies (e.g., first and second integrated circuit dies 104, 110) to affix or adhere to.

Figure 5:
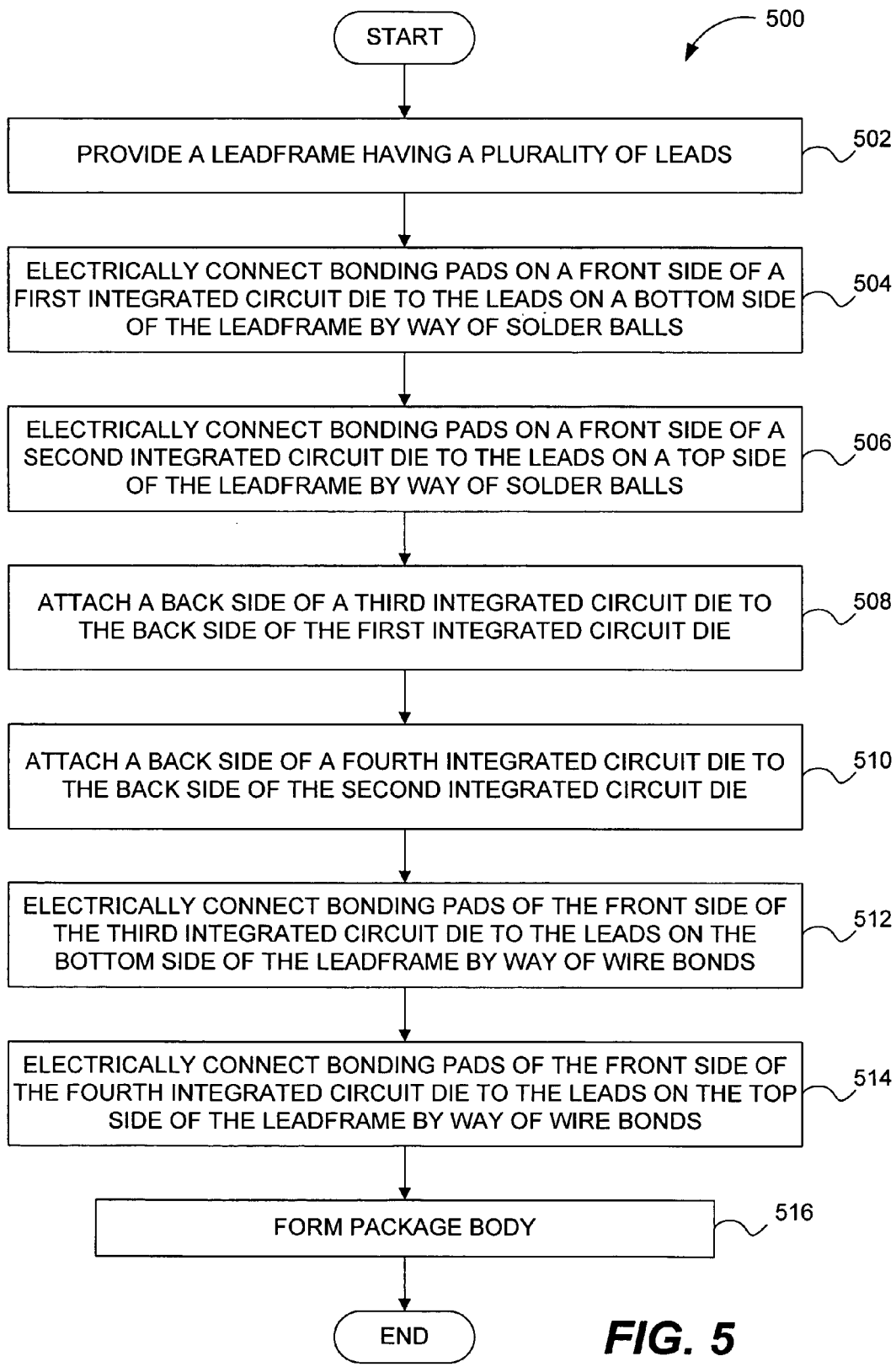
FIG. 5 is a flow diagram of package assembly processing according to one embodiment of the invention.

FIG. 5 is a flow diagram of package assembly processing 500 according to one embodiment of the invention. The package assembly processing 500 produces an integrated circuit package. The package assembly processing 500 is, for example, suitable for use to produce the integrated circuit package 100 illustrated in FIG. 1.

The package assembly processing 500 initially provides 502 a leadframe having a plurality of leads. The leadframe is a conductive material such as metal. Typically, the leadframe is copper. The integrated circuit package to be produced by the package assembly processing 500 is, in this embodiment, assumed to be a single integrated circuit package that contains four integrated circuit dies. Each of the integrated circuit dies has a front side that includes a plurality of bonding pads and a back side (or substrate-side) without bonding pads or exposed circuitry.

After the leadframe has been provided 502, the bonding pads on the front side of the first integrated circuit die are electrically connected 504 to leads on a bottom side of the leadframe. Typically, these connections between the bonding pads of the first integrated circuit and the leads of the leadframe are obtained through solder balls. Similarly, the bonding pads on the front side of the second integrated circuit die are electrically connected 506 to the leads on the top side of the leadframe. Again, these connections with respect to the second integrated circuit die and the leads of the leadframe are by way of solder balls.

In one embodiment, the bonding pads of the first and second integrated circuit dies have solder balls previously placed thereon (e.g., with a screen print process). Then, when the solder balls are brought in contact with the leads and the solder is reflowed, the electrical connections between the leads and the bonding pads of the first and second integrated circuits are able to be achieved.

Next, the back side of the third integrated circuit die is attached 508 to the back side of the first integrated circuit die. Similarly, the back side of the fourth integrated circuit die is attached 510 to the back side of the second integrated circuit die. In one implementation, the attachment 508, 510 can be performed by an adhesive provided between the respective back sides of the pair of integrated circuit dies being attached.

Further, the bonding pads on the front side of the third integrated circuit die are electrically connected 512 to the leads on the bottom side of the leadframe. Similarly, the bonding pads on the front side of the fourth integrated circuit die are electrically connected 514 to the leads on the top side of the leadframe. In one implementation, these electrical connections with respect to the bonding pads of the third and fourth integrated circuit dies and the leads on the leadframe are by way of wire bonds.

Next, a package body is formed 516. Here, the package body is formed around the leadframe, the various integrated circuit dies and the wire bonds so as to form a protected integrated circuit package. Typically, this package body is provided by an encapsulant (or molding material) such as molded resin.

Figure 6A:
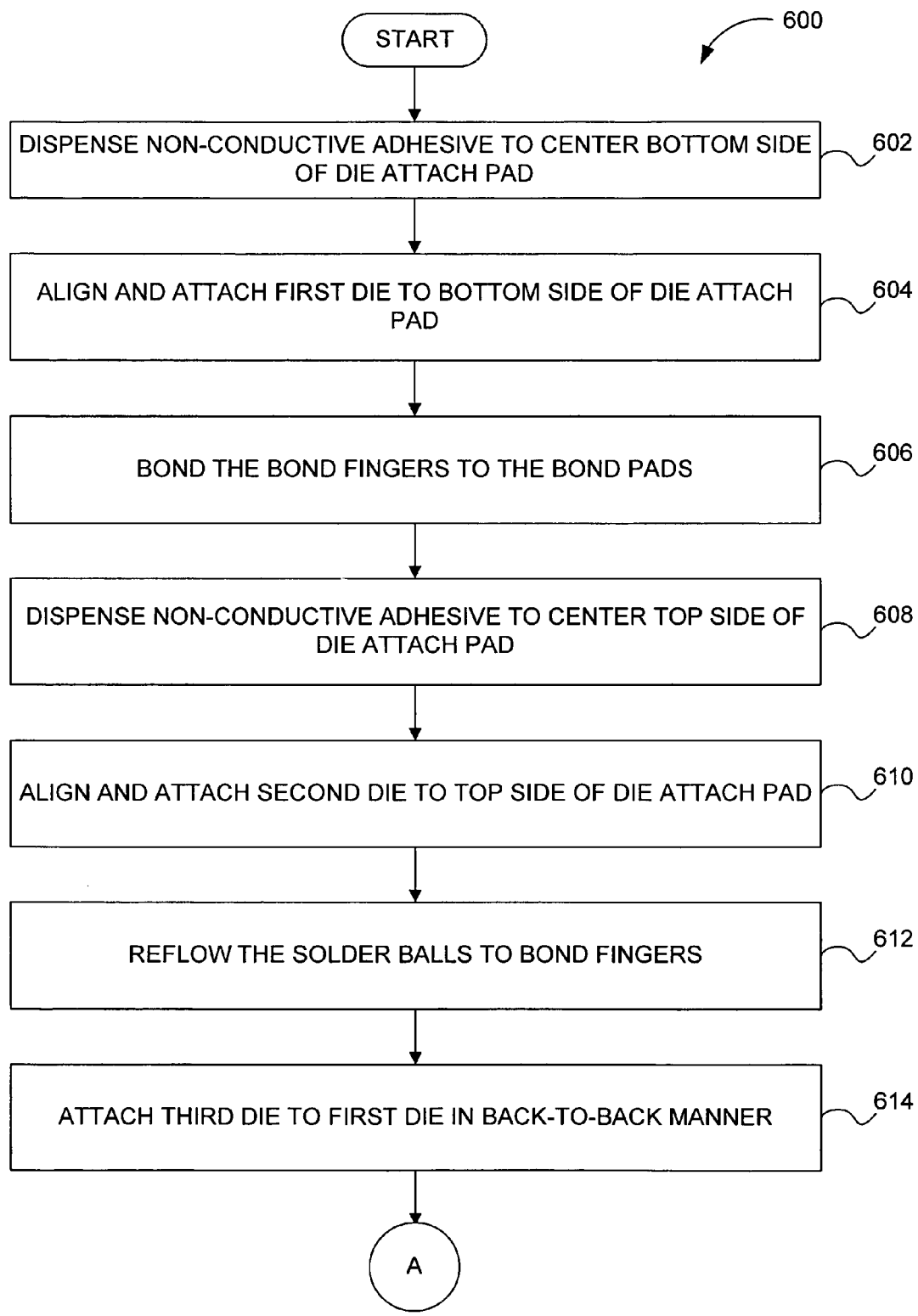
FIGS. 6A and 6B are flow diagrams of package assembly processing according to another embodiment of the invention.
Figure 6B:
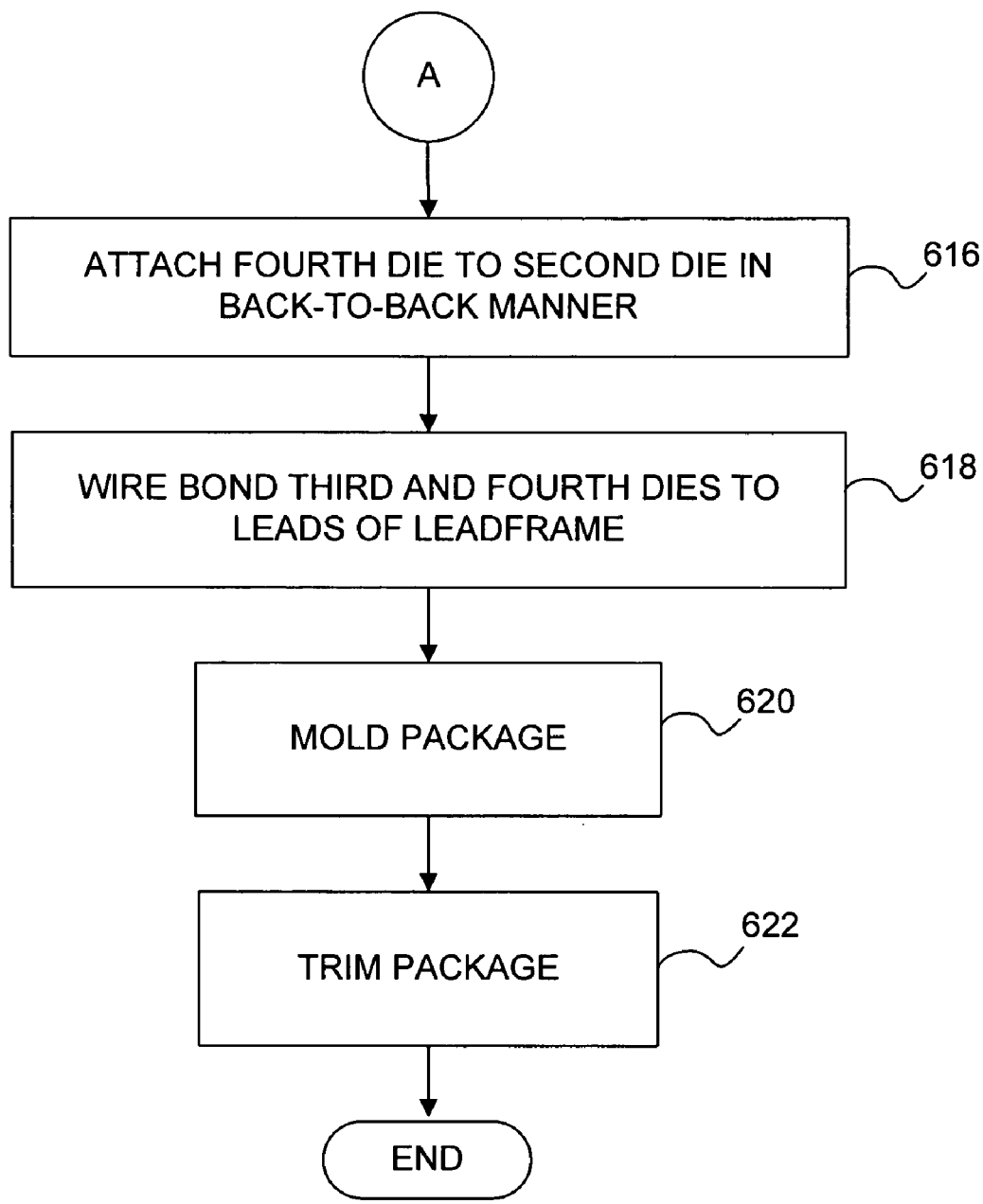

FIGS. 6A and 6B are flow diagrams of package assembly processing 600 according to another embodiment of the invention. The package assembly processing 600 makes use of four integrated circuit dies and a leadframe that has a die attach pad.

The package assembly processing 600 initially dispenses 602 a non-conductive adhesive to a center bottom side of the die attach pad. Then, a first die (integrated circuit die) is aligned and attached 604 to the bottom side of the die attach pad. Here, the first die is attached to the die attach pad by the non-conductive adhesive that has been dispensed 602 thereon. Next, lead fingers of the leads of the leadframe are bonded 606 to the bond pads of the first die. Here, the bonding 606 uses solder balls to electrically connect the lead fingers of the leads of the lead frame to the bond pads of the first die. The solder balls are typically placed on the bond pads of the first die prior to the bonding 606 (e.g., with a screen print process).

Next, a non-conductive adhesive is dispensed 608 to a center top side of the die attach pad of the leadframe. Then a second die is aligned and attached 610 to the top side of the die attach pad. Here, the second die is attached to the die attach pad by the non-conductive adhesive that was dispensed 608 to the center top side of the die attach pad. At this point, the solder balls provided on the bond pads of the first and second dies are reflowed 612 such that the bond fingers of the leads electrically connect to the bond pads of both the first die and the second die. The reflowing 612 of the solder balls can be performed by placing the partially-constructed package into a furnace to allow the solder balls to melt and flow and thus provide a robust electrical connection.

Next, a third die is attached 614 to the first die in a back-to-back manner. Also, a fourth die is attached 616 to the second die in a back-to-back manner. More particularly, the back side of the third die is attached 614 tote back side of the first die, and the back side of the fourth die is attached 616 to the back side of the second die. Here, the attachment 614 and 616 can be facilitated by a layer of adhesive provided on the back side of either the third die or the first die as well as either the fourth die or second die. As needed, to ensure the attachment 614 and 616, the adhesive can be allowed to cure as appropriate given the type of adhesive utilized.

Next, the third and fourth dies are wire bonded 618 to the leads of the leadframe. More particularly, the bond pads of the third and fourth dies are wire bonded 618 to certain of the leads of the leadframe. Here, in one embodiment, the leads can have a flattened area (e.g., the flattened area 406) to facilitate attachment of the wire bonds to the leads of the lead frame.

Thereafter, a package is molded 620. For example, a bonded sandwich mold can be utilized to provide encapsulant surrounding the components of the integrated circuit package being formed. After the mold/encapsulant has cured, the package can be trimmed 622. The trimming of the package can remove any excess material, remove the dambar, and otherwise finalize the package. After the package has been finalized, the package assembly processing 600 is complete and ends.

Figure 7:
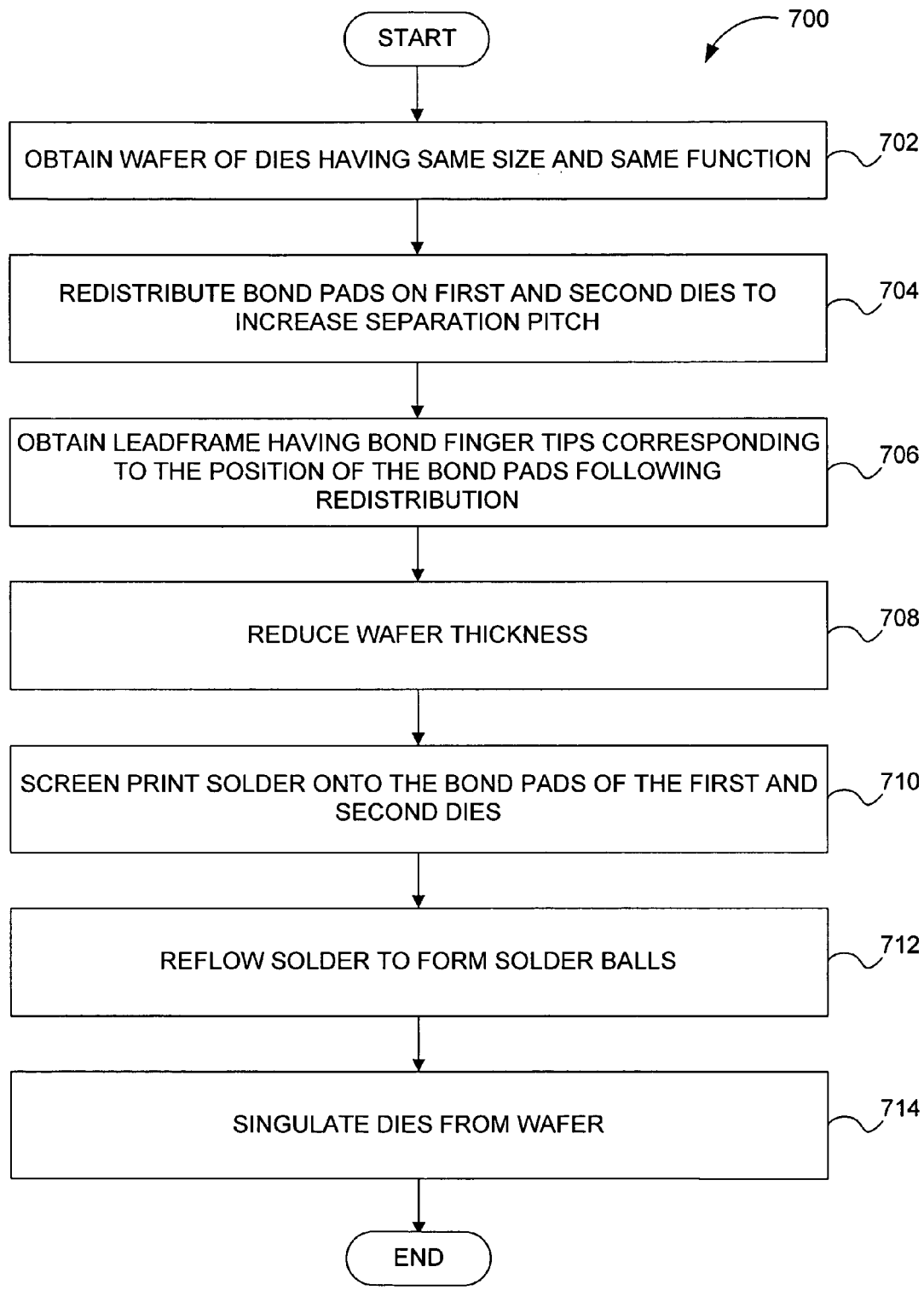
FIG. 7 is a flow diagram of package component preparation processing according to one embodiment of the invention.

FIG. 7 is a flow diagram of package component preparation processing 700 according to one embodiment of the invention. Assume for this embodiment that a four integrated circuit die package is to be formed, such as the integrated circuit package 100 shown in FIG. 1. Each of the integrated circuit dies are of the same size and same functionality, though the first and second dies are produced on a first wafer, and the third and fourth integrated circuit dies are produced on a second wafer. The package component preparation processing 700 pertains to preprocessing that is performed with respect to the first wafer in order to facilitate creation of the integrated circuit package according to the invention.

The package component preparation processing 700 initially obtains 702 a wafer of dies having the same size and same functionality. Here, the wafer is assumed to be the first wafer or the second wafer and thus includes the first dies and the second dies. The first and second dies have the same size and functionality, the only significant difference being that the bonding pads of the second die have a mirror arrangement as compared to the bonding pads of the first die.

Next, bond pads of the first and second dies on the first and second wafers are redistributed 704 to increase separation pitch. Here, it is assumed that the wafer at the beginning of the package component preparation processing 700 has a typical separation pitch of 0.1-0.15 mm (~4-6 mils) for the bond pads. While such separation pitch for bond pads may be suitable for use with respect to wire bonding, the separation pitch is too small when the first and second dies are to be utilized with solder balls. Hence, the bond pads of the first and second dies on the first and second wafers are redistributed 704 at the wafer level to increase the separation pitch. In one example, a separation pitch of about 0.5 mm (~20 mils) is effective, though a separation pitch of greater than about 0.25 mm (~10 mils) is adequate. Additionally, while increasing the separation pitch, the area (or size) of the bond pads are themselves increased. In one example, the bond pads are approximately square with each side about 0.25-0.5 mm (~10-20 mils) in length.

Next, a lead frame having bond fingertips corresponding to the position of the bond pads on the first and second dies following redistribution is obtained 706. In other words, the bond fingers for the leads of the lead frame need to arranged to align with the position of the bond pads on the first and second dies following the redistribution 704.

Thereafter, the thickness of the wafer is reduced 708. Here, the foundry that produced the wafer is assumed to have used standard procedures and wafer size and thickness. However, in the current invention, the thickness of the resulting package is very thin and to achieve this minimal thickness, the thickness of the first and second dies needs to itself be of minimal thickness. Hence, the reduction 708 in the wafer thickness operates to make the first and second dies thinner. With current wafers, the thickness from a foundry tends to be on the order of about 0.4-0.5 mm (~16-21 mils). The reduction 708 serves to reduce the thickness to about 0.075 mm (~3 mils), or more generally about 0.05-0.125 mm (~2-5 mils). The minimal thickness for the wafer is often dependent on the desired thickness of the resulting integrated circuit package and/or on the number if integrated circuit dies being stacked. In any case, the wafer thickness can be reduced 708 by a variety of means. Typically, the wafer would be ground down or polished using conventional techniques, such as grinding followed by lapping (or polishing) to make the wafer thinner.

Next, solder is screen printed 710 onto the bond pads of the first and second dies on the first and second wafers. Here, the solder is screen printed 710 to place small amounts of solder on the bond pads of the first and second dies. In one embodiment, the solder utilized is high temperature solder. The solder that has been screen printed 710 is then reflowed 712 to form small solder balls. When the screen print 710 of the solder was performed, the solder on the bonding pads was not necessarily uniform or arranged into solder balls. Hence, by reflowing 712 the solder, uniform solder balls are obtained on the bonding pads. Next, the various dies provided on the wafer, namely, the first and second dies, can be singulated 714 from the first and second wafers. Typically, the first and second wafers have an array of first and second dies respectively thereon. These first and second dies can be singulated from the wafers by a saw process. At this point, the first and second dies that are obtained from the first and second wafers can be utilized to form the integrated circuit package according to the invention, such as the integrated circuit package 100 shown in FIG. 1.

The second wafer carries the third and fourth dies that are utilized in forming the integrated circuit package. The package component preparation processing performed with respect to the second wafer is similar to that discussed above with respect to FIG. 7. However, there is no need to redistribute 704 the bond pads on the third and fourth dies as the conventional distribution of the bond pads is sufficient. Nevertheless, the redistribution of the bond pads on the third and fourth dies is permissible. Also, the leadframe has already been obtained 706 and configured to correspond to the redistribution of the bond pads of the first and second wafers. There are no further requirements placed on the leadframe for the third and fourth dies, except perhaps the flattened areas 406 to facilitate wire bonding. Hence, the operations 704 and 706 are not needed with respect to the third and fourth wafers in most embodiments. Further, the operations 710 and 712 are not needed with respect to the third and fourth wafers, because solder balls are not utilized on the bond pads of the third and fourth dies. However, the third and fourth wafers, in one embodiment, can have an adhesive placed on the back side of the wafer prior to the singulation 714 of the third and fourth dies from the third and fourth wafers. For example, the adhesive can be a dry film adhesive can have a thickness of about 0.025 mm (~1 mils).

The integrated circuit packages according to the invention can be used in memory systems. The invention can further pertain to an electronic system that includes a memory system as discussed above. Memory systems are commonly used to store digital data for use with various electronics products. Often, the memory system is removable from the electronic system so the stored digital data is portable. These memory systems can be referred to as memory cards. The memory systems according to the invention can have a relatively small form factor and be used to store digital data for electronics products such as cameras, hand-held or notebook computers, network cards, network appliances, set-top boxes, hand-held or other small audio players/recorders (e.g., MP3 devices), and medical monitors. Examples of memory cards include PC Card (formerly PCMCIA device), Flash Card, Secure Digital (SD) Card, Multimedia Card (MMC card), and ATA Card (e.g., Compact Flash card). As an example, the memory cards can use Flash type or EEPROM type memory cells to store the data. More generally, a memory system can pertain to not only a memory card but also a memory stick or some other semiconductor memory product.

The advantages of the invention are numerous. Different embodiments or implementations may yield one or more of the following advantages. One advantage of the invention is that substantially same size integrated circuit chips are able to be stacked within a thin integrated circuit package. Another advantage of the invention is that overall package thickness is maintained thin, yet integrated circuit chip density is dramatically increased. Still another advantage of the invention is that high density memory integrated circuit packages can be obtained (e.g., Flash memory).

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A non-volatile memory integrated circuit package, comprising:
   a leadframe having a plurality of electrically conductive leads, each lead including a lead finger having a hole for coupling one or more solder balls to the lead;
   a first memory-storage integrated circuit die having an active side and a non-active side, the active side of said first integrated circuit die having bonding pads that are electrically connected to the electrically conductive leads of said leadframe;
   a second memory-storage integrated circuit die having an active side and a non-active side, the active side of said second integrated circuit die having bonding pads that are electrically connected to the electrically conductive leads of said leadframe;
   a lower adhesive provided on the non-active side of said first integrated circuit die; and
   a third memory-storage integrated circuit die having an active side and a non-active side, the non-active side of said third integrated circuit die being affixed to the non-active side of said first integrated circuit die by said lower adhesive, and the active side of said third integrated circuit die having bonding pads that are electrically connected to the electrically conductive leads of said leadframe by wire bonds.

2. The integrated circuit package as recited in claim 1, wherein the bonding pads of said first and second integrated circuit dies are mirrored arrangements of one another, and
wherein the thickness of said integrated circuit package is not greater than 1.0 millimeter.

3. The integrated circuit package as recited in claim 1, wherein the bonding pads of the active side of said first and second integrated circuit dies have solder balls thereon, and
wherein the solder balls are used to electrically connect not only the bonding pads of the active side of said first integrated circuit die but also the bonding pads of the active side of said second integrated circuit die to the electrically conductive leads of said leadframe, such that a corresponding pair of solder balls, one from each of said first and second integrated circuit dies, after reflowing forms a single solder connection between one of the electrically conductive leads, one of the bonding pads of the active side of said first integrated circuit die, and a corresponding one of the bonding pads of the active side of said second integrated circuit die.

4. The integrated circuit package as recited in claim 3, wherein each of the electrically conductive leads of said leadframe has a hole adjacent to the corresponding pair of solder balls.

5. The integrated circuit package as recited in claim 1, wherein each of said first, second and third integrated circuit dies is about the same size, and
   wherein there is no spacer provided between said first and third integrated circuit dies.

6. A non-volatile memory integrated circuit package, comprising:
   a leadframe having a plurality of electrically conductive leads;
   a first memory-storage integrated circuit die having an active side and a non-active side, the active side of said first integrated circuit die having bonding pads that are electrically connected to the electrically conductive leads of said leadframe;
   a second memory-storage integrated circuit die having an active side and a non-active side, the active side of said second integrated circuit die having bonding pads that are electrically connected to the electrically conductive leads of said leadframe;
   a lower adhesive provided on the non-active side of said first integrated circuit die;
   a third memory-storage integrated circuit die having an active side and a non-active side, the non-active side of said third integrated circuit die being affixed to the non-active side of said first integrated circuit die by said lower adhesive, and the active side of said third integrated circuit die having bonding pads that are electrically connected to the electrically conductive leads of said leadframe;

an upper adhesive provided on the non-active side of said second integrated circuit die;

a fourth memory-storage integrated circuit die having an active side and a non-active side, the non-active side of said fourth integrated circuit die being affixed to the non-active side of said second integrated circuit die by said upper adhesive, and the active side of said fourth integrated circuit die having bonding pads that are electrically connected to the electrically conductive leads of said leadframe; and an encapsulant molded to form a body of said integrated circuit package, wherein the thickness of said body including said integrated circuit package is not greater than 1.0 millimeter;

wherein each of said first, second, third and fourth integrated circuit dies is about the same size, wherein the bonding pads of said first and second integrated circuit dies are mirrored arrangements of one another, wherein said integrated circuit package is a Thin Small Outline Package (TSOP), wherein the bonding pads of the active side of said first and second integrated circuit dies have solder balls thereon, and wherein the solder balls are used to electrically connect not only the bonding pads of the active side of said first integrated circuit die but also the bonding pads of the active side of said second integrated circuit die to the electrically conductive leads of said leadframe, such that a corresponding pair of solder balls, one from each of said first and second integrated circuit dies, are used to provide an electrical connection between one of the electrically conductive leads, one of the bonding pads of the active side of said first integrated circuit die, and a corresponding one of the bonding pads of the active side of said second integrated circuit die, and wherein each of the electrically conductive leads of said leadframe has a hole adjacent to the corresponding pair of solder balls.

7. The integrated circuit package as recited in claim 6, wherein in producing said integrated circuit package, the corresponding pair of solder balls are reflowed such that they merge via the hole adjacent thereto.

8. The integrated circuit package as recited in claim 6, wherein wire bonds are used to electrically connect the bonding pads of the active side of said third and fourth integrated circuit dies to the electrically conductive leads of said leadframe.

9. The integrated circuit package as recited in claim 8, wherein each of the electrically conductive leads of said leadframe has a hole adjacent to the corresponding pair of solder balls.

10. The integrated circuit package as recited in claim 6, wherein the spacing of the bonding pads of the active side of said third and fourth integrated circuit dies is significantly smaller than the spacing of the bonding pads of the active side of said first and second integrated circuit dies.

11. The integrated circuit package as recited in claim 10, wherein the spacing of the bonding pads of the active side of said first and second integrated circuit dies is increased by redistribution of the bonding pads on the active side of said first and second integrated circuits.

12. The integrated circuit package as recited in claim 6, wherein wire bonds are used to electrically connect the bonding pads of the active side of said third and fourth integrated circuit dies to the electrically conductive leads of said leadframe.

13. The integrated circuit package as recited in claim 12, wherein solder balls are used to electrically connect the bonding pads of the active side of said first and second integrated circuit dies to the electrically conductive leads of said leadframe.

14. The integrated circuit package as recited in claim 13, wherein functionality of each of said first, second, third and fourth integrated circuit dies is the same.

15. The integrated circuit package as recited in claim 13,
wherein the bonding pads of said first and second integrated circuit dies are mirrored arrangements of one another,
wherein the bonding pads of said third and fourth integrated circuit dies are mirrored arrangements of one another, and
wherein functionality of each of said first, second, third and fourth integrated circuit dies is the same.

16. The integrated circuit package as recited in claim 6, wherein the thickness of said integrated circuit package is not greater than 1.0 millimeter.

17. The integrated circuit package as recited in claim 6, wherein the bonding pads of said third and fourth integrated circuit dies are mirrored arrangements of one another.

18. The integrated circuit package as recited in claim 6,
wherein said leadframe further includes a die attach pad, the die attach pad having a top surface and a bottom surface,
wherein said first integrated circuit die is affixed to the bottom side of the die attach pad by at least an adhesive provided between said first integrated circuit die and the die attach pad, and
wherein said second integrated circuit die is affixed to the top side of the die attach pad by at least an adhesive provided between said second integrated circuit die and the die attach pad.

19. The integrated circuit package as recited in claim 6, wherein solder balls are used to electrically connect the bonding pads of the active side of said first integrated circuit die to the electrically conductive leads of said leadframe.

20. The integrated circuit package as recited in claim 6, wherein solder balls are used to electrically connect the bonding pads of the active side of said first and second integrated circuit dies to the electrically conductive leads of said leadframe.

21. The integrated circuit package as recited in claim 6, wherein solder balls are used to electrically and mechanically connect the bonding pads of the active side of said first integrated circuit die to the electrically conductive leads of said leadframe.

* * * * *